US012666844B2

(12) United States Patent
Wei et al.

(10) Patent No.: US 12,666,844 B2
(45) Date of Patent: Jun. 23, 2026

(54) DISPLAY PANEL HAVING BACKPLATE WITH RECESSES AND DISPLAY DEVICE COMPRISING DISPLAY PANEL

(71) Applicants: YUNNAN INVENSIGHT OPTOELECTRONICS TECHNOLOGY CO., LTD., Kunming (CN); BOE TECHNOLOGY GROUP CO., LTD., Beijing (CN)

(72) Inventors: Junbo Wei, Beijing (CN); Shengji Yang, Beijing (CN); Pengcheng Lu, Beijing (CN); Kuanta Huang, Beijing (CN); Yuanlan Tian, Beijing (CN)

(73) Assignees: YUNNAN INVENSIGHT OPTOELECTRONICS TECHNOLOGY CO., LTD., Yunnan (CN); BOE TECHNOLOGY GROUP CO., LTD., Beijing (CN)

( * ) Notice: Subject to any disclaimer, the term of this patent is extended or adjusted under 35 U.S.C. 154(b) by 379 days.

(21) Appl. No.: 18/278,339

(22) PCT Filed: Sep. 30, 2022

(86) PCT No.: PCT/CN2022/123092
§ 371 (c)(1),
(2) Date: Aug. 22, 2023

(87) PCT Pub. No.: WO2024/065616
PCT Pub. Date: Apr. 4, 2024

(65) Prior Publication Data
US 2025/0081803 A1 Mar. 6, 2025

(51) Int. Cl.
*H10K 59/80* (2023.01)
*H10K 59/12* (2023.01)
(Continued)

(52) U.S. Cl.
CPC ... *H10K 59/80515* (2023.02); *H10K 59/1201* (2023.02); *H10K 59/122* (2023.02); *H10K 59/124* (2023.02); *H10K 59/873* (2023.02)

(58) Field of Classification Search
None
See application file for complete search history.

(56) References Cited

U.S. PATENT DOCUMENTS 10,714,547 B2 7/2020 Heo
2017/0053971 A1* 2/2017 Sato ..................... H10K 59/131
(Continued)

FOREIGN PATENT DOCUMENTS

CN 103562777 A 2/2014
CN 107464833 A 12/2017
(Continued)

OTHER PUBLICATIONS

European Extended Search Report, Application No. 22960243.8, dated Jan. 31, 2025, 11 pps.

*Primary Examiner* — Nduka E Ojeh
(74) *Attorney, Agent, or Firm* — Armstrong Teasdale LLP

(57) ABSTRACT

Embodiments of the present disclosure relate to a display panel and a display device. The display panel includes a backplate including a plurality of pixel areas and a plurality of recesses configured to separate the plurality of pixel areas from each other, and a plurality of first electrodes on the backplate, wherein orthographic projections of the plurality of first electrodes on the backplate partially overlaps with the plurality of pixel areas, respectively, and wherein at least one of the plurality of first electrodes extends to a bottom surface of the recesses neighboring to the first electrodes.

16 Claims, 8 Drawing Sheets

(51) Int. Cl.
   H10K 59/122        (2023.01)
   H10K 59/124        (2023.01)

(56)                References Cited

U.S. PATENT DOCUMENTS

| | | | |
|---|---|---|---|
| 2022/0077255 | A1 | 3/2022 | Li et al. |
| 2022/0115469 | A1* | 4/2022 | Huang ............. H10K 59/80521 |
| 2022/0199709 | A1 | 6/2022 | Baik et al. |
| 2023/0165061 | A1* | 5/2023 | Huang ................. H10K 59/122 |
| | | | 257/91 |
| 2024/0164135 | A1* | 5/2024 | Heo ..................... H10K 59/122 |
| 2024/0215346 | A1* | 6/2024 | Yang .................... H10K 59/131 |
| 2024/0224639 | A1* | 7/2024 | Yang ................. H10K 59/1201 |

FOREIGN PATENT DOCUMENTS

| | | | |
|---|---|---|---|
| CN | 107682001 | A | 2/2018 |
| CN | 111668381 | A | 9/2020 |
| CN | 111668382 | A | 9/2020 |
| CN | 212182332 | U | 12/2020 |
| CN | 113921573 | A | 1/2022 |
| CN | 114097092 | A | 2/2022 |
| JP | 2008010275 | A | 1/2008 |
| JP | 2011176190 | A | 9/2011 |
| KR | 20140042223 | A | 4/2014 |
| KR | 20150077261 | A | 7/2015 |
| KR | 20190074088 | A | 6/2019 |
| WO | 2021213439 | A1 | 10/2021 |

* cited by examiner

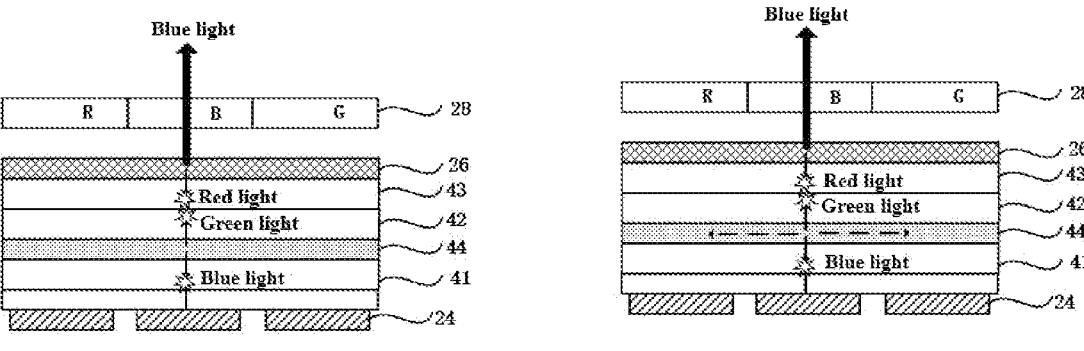
FIG. 4A                              FIG. 4B
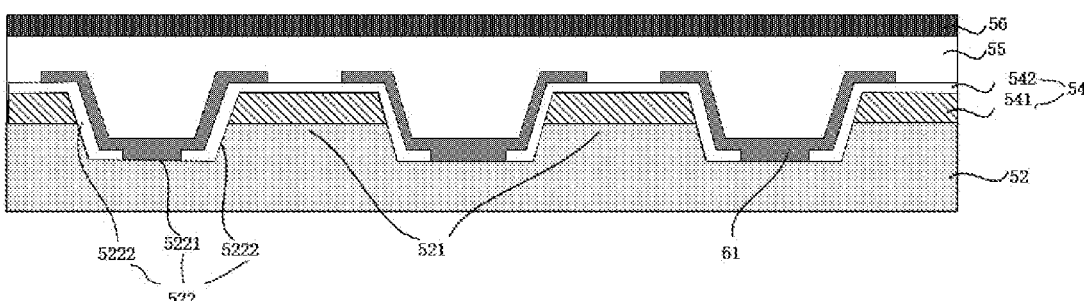
FIG. 5
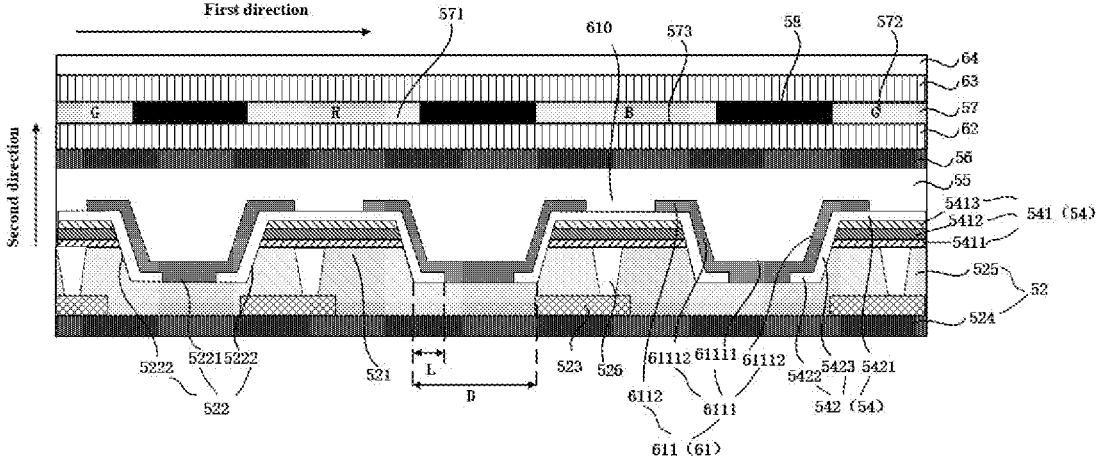
FIG. 6

DISPLAY PANEL HAVING BACKPLATE WITH RECESSES AND DISPLAY DEVICE COMPRISING DISPLAY PANEL

CROSS REFERENCE TO RELATED APPLICATIONS

This patent application is a National Stage Entry of PCT/CN2022/123092 filed on Sep. 30, 2022, the disclosure of which is incorporated by reference herein in its entirety as part of the present application.

BACKGROUND

The present disclosure relates to the field of display technology, and in particular, to a display panel and a display device.

An Organic Light-Emitting Diode (OLED) display device, also known as an organic electroluminescent display device, is a different display device from the traditional liquid crystal display (LCD). Such display technology has the advantages of simple structure, self-luminescence, high contrast, thin thickness, wide viewing angle, fast response time, continuously adjustable luminous color, and being usable in a flexible panel, etc. Therefore, it has become one of the important development directions of a new generation of display devices, and has received more and more attention.

However, due to the manufacturing process and other reasons, the performance of OLED display devices still needs to be improved.

BRIEF DESCRIPTION

Embodiments of the present disclosure provide a display panel and a display device.

An aspect of the present disclosure provides a display panel including a backplate including a plurality of pixel areas and a plurality of recesses configured to separate the plurality of pixel areas from each other, and a plurality of first electrodes on the backplate, wherein orthographic projections of the plurality of first electrodes on the backplate partially overlap with the plurality of pixel areas, respectively, and at least one of the plurality of first electrodes extends to a bottom surface of the recess neighboring to the at least one first electrode such that a portion of the at least one of the plurality of first electrodes is located on the bottom surface of the neighboring recess.

In an embodiment relating to the display panel, at least one of the plurality of first electrodes includes a first conductive portion on the pixel area of the backplate, and a second conductive portion covering the first conductive portion and extending a width over the bottom surface of the recess adjacent to the first conductive portion.

In an embodiment relating to the display panel, the second conductive portion includes an intermediate portion on the first conductive portion, an extension portion on the bottom surface of the recess, and a connecting portion connecting the intermediate portion and the extension portion.

In an embodiment relating to the display panel, a width of the extension portion is equal to 1/6 to 1/3 of a width of the bottom surface of the recess where the extension portion is located.

In an embodiment relating to the display panel, extending surfaces of two sidewalls of the recess intersect and an intersection line of the extending surfaces of the two sidewalls is located on a side of the bottom surface of the recess away from an opening of the recess or on a side of the bottom surface of the recess facing the opening of the recess.

In an embodiment relating to the display panel, a slope of a side of the first conductive portion is the same as a slope of a sidewall of the recess adjacent to the side.

In an embodiment relating to the display panel, the side of the first conductive portion and the sidewall of the recess adjacent to the side are coplanar.

In an embodiment relating to the display panel, a slope of a side of the first conductive portion is less than a slope of a sidewall of the recess adjacent to the side.

In an embodiment relating to the display panel, a side of the first conductive portion is non-planar, and includes a first inclined face and a second inclined face, wherein a slope of the first inclined face is less than a slope of the second inclined face, an angle formed by the first inclined face and the second inclined face is an obtuse angle, and an angle formed by the first inclined face and a surface of the backplate where the first conductive portion is located is an acute angle.

In an embodiment relating to the display panel, the first conductive portion includes a first layer on the backplate, a second layer on the first layer, and a third layer on the second layer.

In an embodiment relating to the display panel, the first inclined face is a side of the first layer, and the second inclined face is a surface formed by a side of the second layer and a side of the third layer together.

In an embodiment relating to the display panel, a sidewall of the recess includes an inner recessed structure recessed toward an interior of the backplate and located at a position of the sidewall of the recess that is in proximity to the first conductive portion.

In an embodiment relating to the display panel, a depth of the inner recessed structure is less than a width of an orthographic projection of the first inclined face on the backplate.

In an embodiment relating to the display panel, the bottom surface of the recess includes a sub-recess having a width substantially equal to a distance between the extension portions in a same recess, of adjacent second conductive portions.

In an embodiment relating to the display panel, a depth of the sub-recesses is not greater than 1/3 of a minimum depth of the recesses.

In an embodiment relating to the display panel, the connecting portion conformally covers a side of the first conductive portion and a sidewall of the recess.

In an embodiments relating to the display panel, the display panel further includes a pixel definition layer having an opening exposing a portion of the intermediate portion of the second conductive portion, wherein the pixel definition layer includes a plurality of pixel definition units, each pixel definition unit including a first recessed portion in the recess and a first flat portion on either side of the first recessed portion, wherein the first recessed portion includes a sidewall portion covering the connecting portion and a bottom on the bottom surface of the recess and the extension portion of the second conductive portion, and the first flat portion covers another portion of the intermediate portion that is not exposed by the opening.

In an embodiment relating to the display panel, an inclination angle of the connecting portion of the second conductive portion with respect to the extension portion is less than or equal to an inclination angle of the sidewall of the first recessed portion with respect to the bottom.

In an embodiment relating to the display panel, the inclination angle of the connecting portion of the second conductive portion is in a range of 80° to 120° and the inclination angle of the sidewall portion of the first recessed portion is in a range of 85° to 125°.

In an embodiment relating to the display panel, a width of the first flat portion of the pixel definition layer is equal to $\frac{1}{20}$ to $\frac{1}{10}$ of a width of the intermediate portion.

In an embodiment relating to the display panel, a thickness of the pixel definition layer is equal to $\frac{1}{4}$ to $\frac{1}{2}$ of a thickness of the first conductive portion.

In an embodiment relating to the display panel, the thickness of the first conductive portion is equal to 1.5 times to 2.5 times a minimum depth of the recess.

In an embodiment relating to the display panel, the thickness of the first conductive portion is equal to 6 times to 8 times a thickness of the second conductive portion.

In an embodiment relating to the display panel, the display panel further includes a light-emitting functional layer on a side of the pixel definition layer away from the backplate, and a second electrode on a side of the light-emitting functional layer away from the backplate.

In an embodiment relating to the display panel, the light-emitting functional layer includes a first light-emitting functional sublayer on a side of the pixel definition layer away from the backplate and configured to emit light of a first color, a charge generating layer on a side of the first light-emitting functional sublayer away from the backplate, a second light-emitting functional sublayer on a side of the charge generating layer away from the backplate and configured to emit light of a second color, and a third light-emitting functional sublayer on a side of the second light-emitting functional sublayer away from the backplate and configured to emit light of a third color.

In an embodiment relating to the display panel, the second electrode includes a plurality of second flat portions corresponding to the plurality of first electrodes, respectively, an orthographic projection of each second flat portion on the backplate being within an orthographic projection of the corresponding first electrode on the backplate, and a plurality of second recessed portions corresponding to the plurality of recesses, respectively, an orthographic projection of each second recessed portion covering an orthographic projection of the corresponding recess on the backplate.

Another aspect of the present disclosure further provides a display device including a display panel as described in any of one or more embodiments of the present disclosure.

Further aspects and areas of applicability will become apparent from the description provided herein. It should be understood that various aspects of this application may be implemented individually or in combination with one or more other aspects. It should also be understood that the description and specific examples herein are intended for purposes of illustration only and are not intended to limit the scope of the present application.

BRIEF DESCRIPTION OF THE DRAWINGS

The drawings described herein are for illustrative purposes only of selected embodiments and not all possible implementations, and are not intended to limit the scope of the present application. In the Figures.

4

Figure 3:
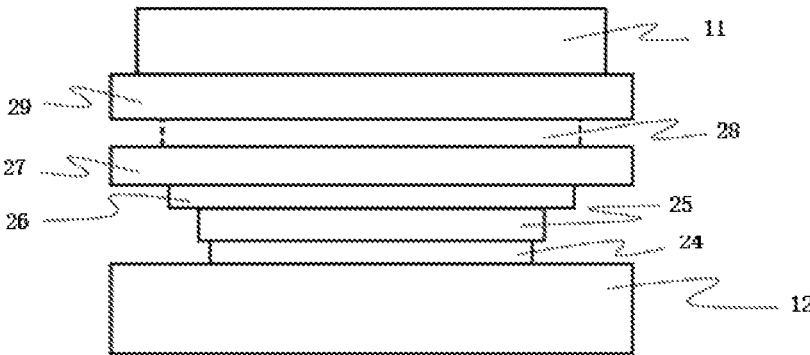
Figure 7A:
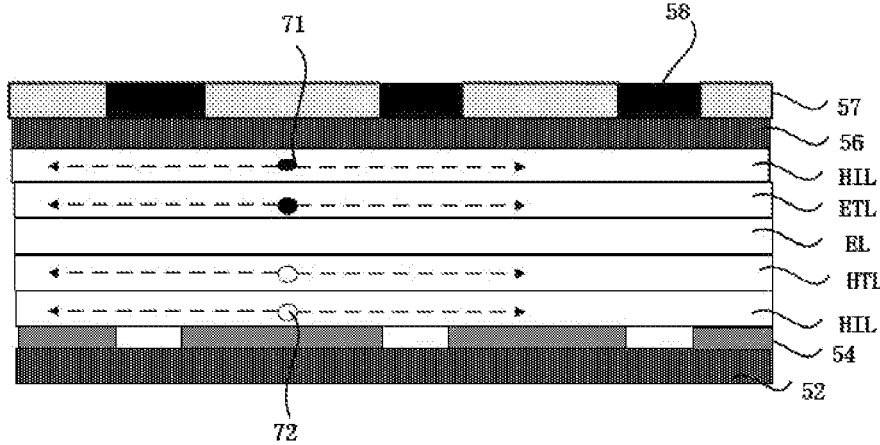
Figure 7B:
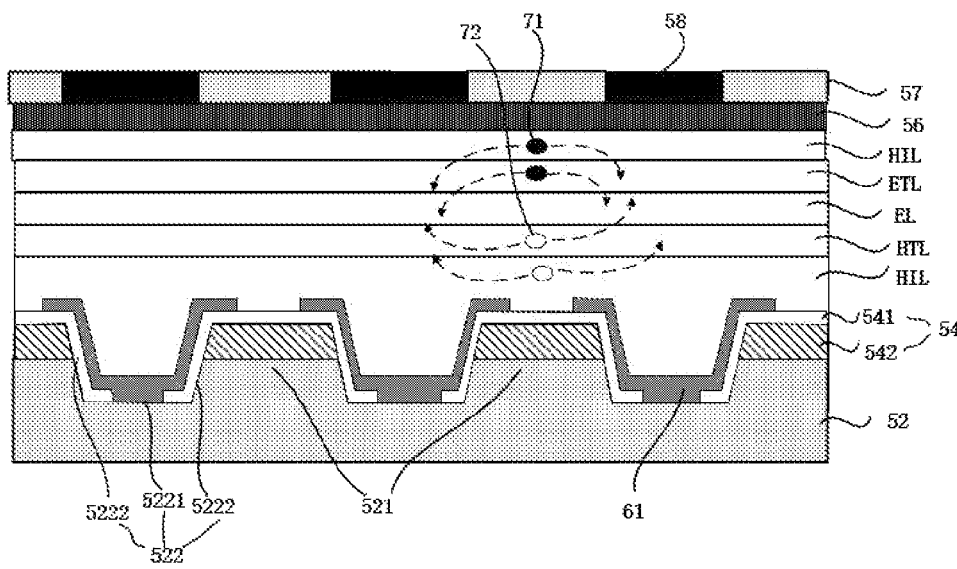
Figure 8A:
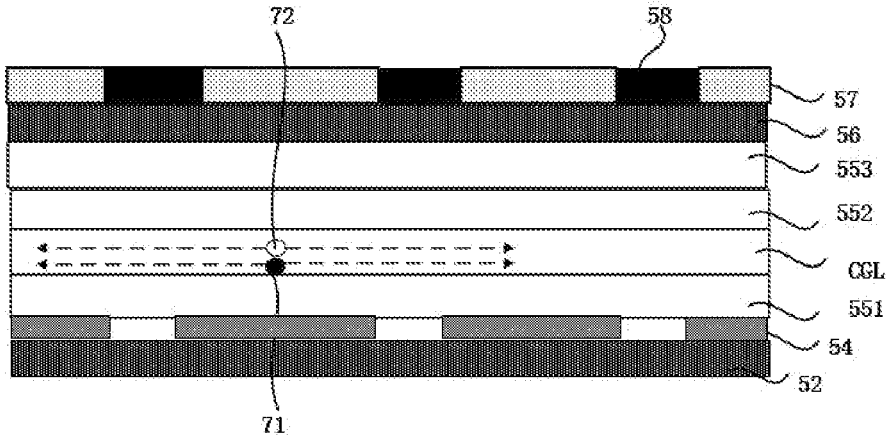
Figure 8B:
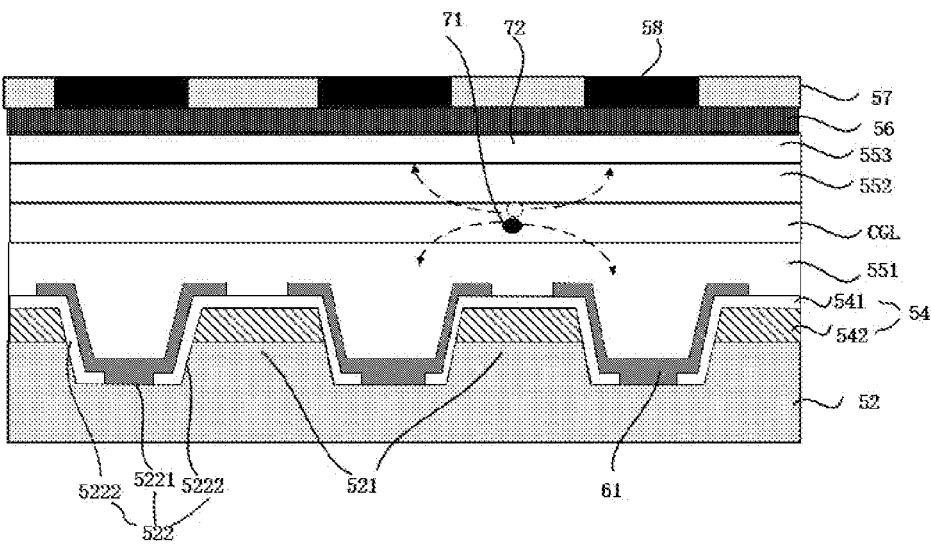
Figure 9:
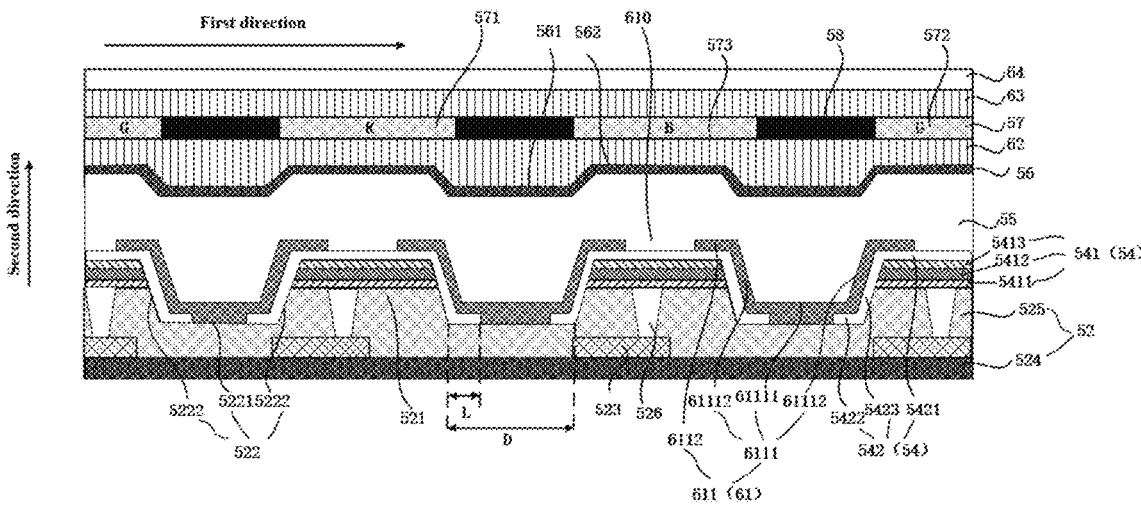
Figure 10:
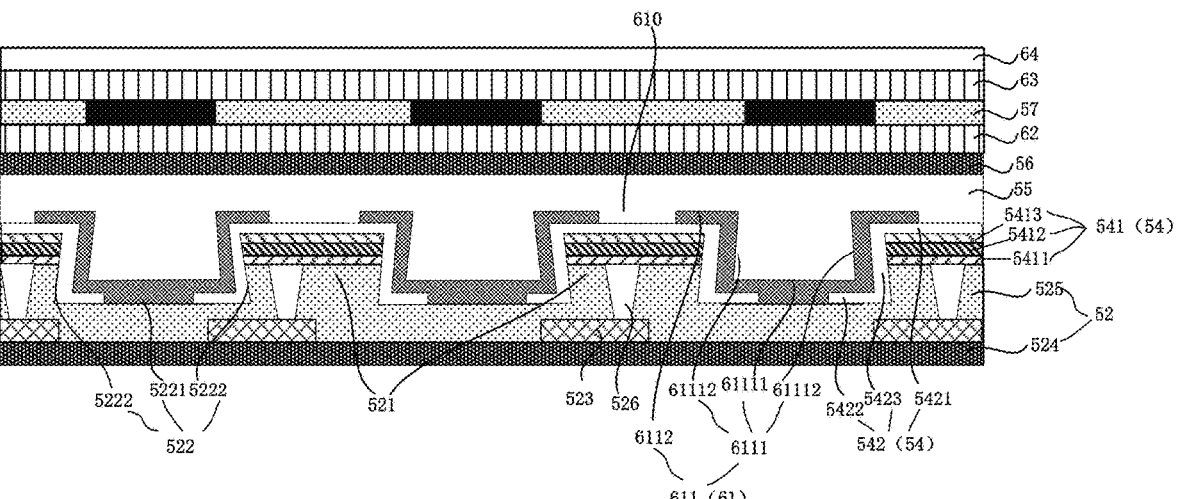
Figure 11:
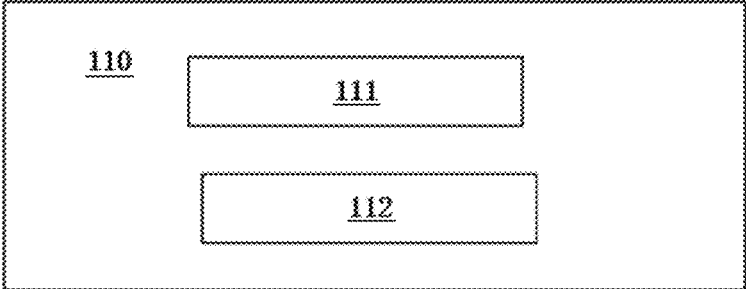
Figure 12:
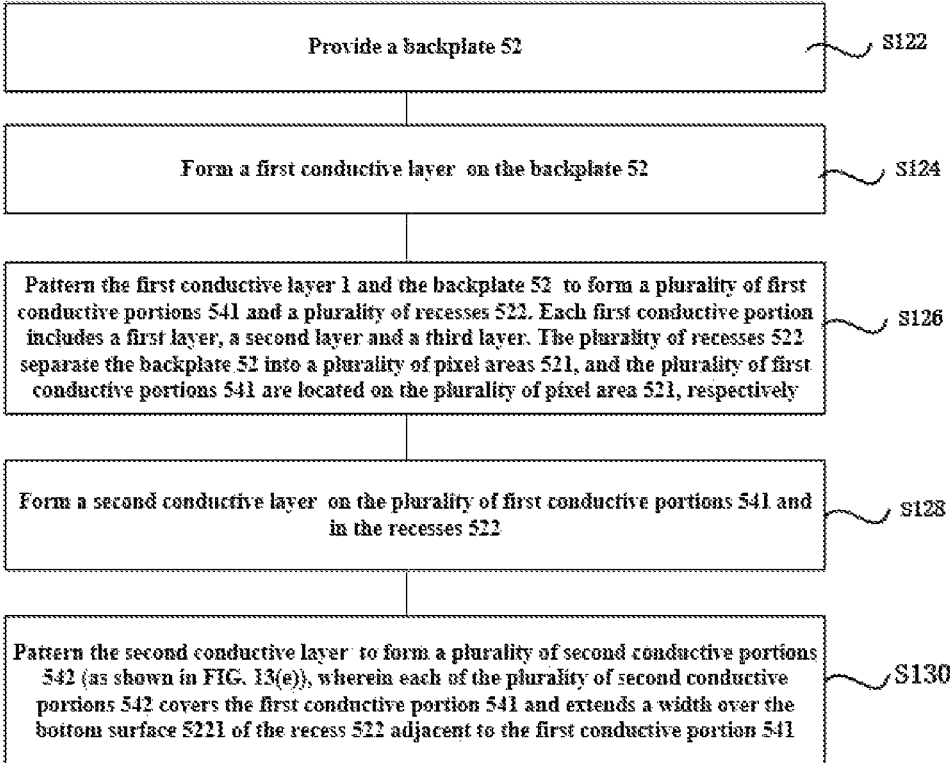
Figure 14:
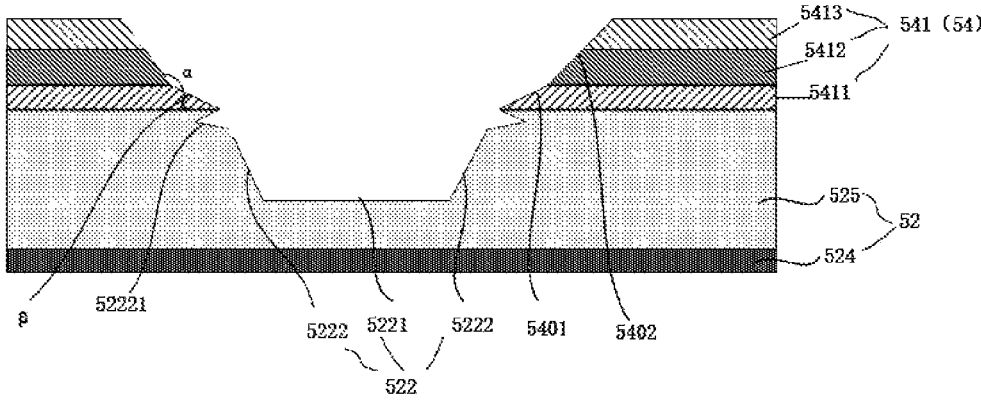
Figure 15:
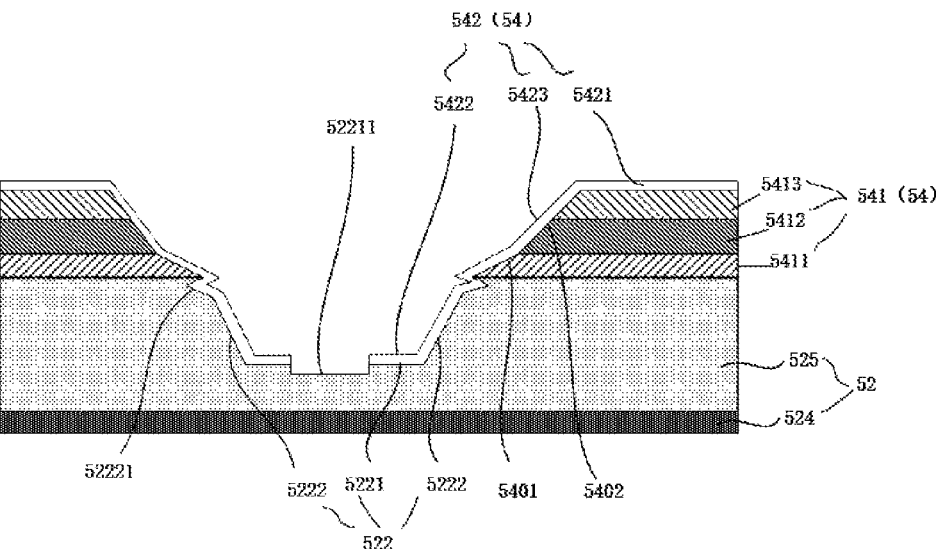

FIG. 3 schematically illustrates a cross-sectional view of an example silicon-based OLED display panel:

FIG. 4A schematically illustrates an example WOLED display panel:

FIG. 4B schematically illustrates crosstalk generation in a WOLED display panel:

FIG. 5 schematically illustrates a cross-sectional view of an example display panel in one or more embodiments of the disclosure:

FIG. 6 schematically illustrates another cross-sectional view of a display panel in one or more embodiments of the present disclosure:

FIG. 7A illustrates a schematic diagram of crosstalk generation in a display panel in the related art:

FIG. 7B illustrates a schematic diagram of crosstalk suppression in a display panel according to an embodiment of the present disclosure;

FIG. 8A illustrates a schematic diagram of crosstalk generation in a display panel having a stacked arrangement of light-emitting functional layers in the related art:

FIG. 8B illustrates a schematic diagram of crosstalk suppression in a display panel having a stacked arrangement of light-emitting functional layers according to an embodiment of the present disclosure;

FIG. 9 schematically illustrates a cross-sectional view of another display panel in one or more embodiments of the present disclosure:

FIG. 10 schematically illustrates a cross-sectional view of yet another display panel in one or more embodiments of the present disclosure:

FIG. 11 schematically illustrates a display device according to one or more embodiments of the present disclosure:

FIG. 12 schematically illustrates a flow chart of a method for preparing a display panel in one or more embodiments of the present disclosure:

FIGS. 13A-13E are schematic diagrams showing a process for preparing a display panel in one or more embodiments of the present disclosure:

FIG. 14 schematically illustrates a first conductive portion having a non-planar side and a recess corresponding thereto in one or more embodiments of the present disclosure; and FIG. 15 schematically illustrates a recess with a sub-recess and corresponding first conductive portion and second conductive portion in one or more embodiments of the present disclosure.

Corresponding reference numerals indicate corresponding parts or features throughout the several views of the drawings.

DETAILED DESCRIPTION

Various embodiments, which are provided as exemplary examples of the present disclosure, will now be described in detail with reference to the accompanying drawings to enable those skilled in the art to implement the present disclosure. It should be noted that the following accompanying drawings and examples are not meant to limit the scope of the present disclosure. Where particular elements of the present disclosure may be partially or fully implemented using known components, only those parts of such known components that are necessary for an understanding of the present disclosure will be described, and the detailed descriptions of other parts of such known components will be omitted so as not to confuse the present disclosure. Further, various embodiments encompass present and future known equivalents to the components referred to herein by way of illustration.

As used herein, the expressions "have", "comprise" and "contain" as well as grammatical variations thereof are used in a non-exclusive way. Thus, the expression "A has B" as well as the expression "A comprises B" or "A contains B" may both refer to the fact that, besides B, A contains one or more further components and/or constituents, and to the case in which, besides B, no other components, constituents, or elements are present in A. The terms "a", "an", "the", "said" and "at least one" are used to mean that there are one or more elements/components/etc.

As used herein, the term "be located on" does, however, not refer to a specific geometric orientation of the final stack in the display panel or the display device with respect to a direction of a gravitational force but rather indicates a way of manufacturing the stack, which, after manufacturing, could, in general, be placed in any geometric orientation, also such as turned upside down. The terms "first", "second", "third", etc. are used for descriptive purposes only and should not be construed to indicate or imply relative importance and order of formation.

As used throughout the text, the respective ranges are used in abbreviated form in order to avoid expanding and describing each value in the range in detail. When appropriate, any suitable value within the range may be selected as the higher value of the range, the lower value, or the end of the range.

An OLED display panel generally includes a backplate, an anode, a pixel definition layer, a hole injection layer (HIL), an electron injection layer (EIL), a hole transport layer (HTL), an electron transport layer (ETL), an organic light-emitting layer (EML), and a cathode, etc. The pixel definition layer may define a plurality of light-emitting devices. Under the action of electric field between the anode and the cathode, holes generated by the anode and electrons generated by the cathode will move and inject into the hole transport layer and the electron transport layer, respectively, and then migrate to the light-emitting layer. When they meet in the light-emitting layer, energy excitons are generated, which excites the light-emitting molecules to eventually produce visible light. However, because the light-emitting functional layer is a whole continuous film layer in the OLED display panel, the sub-pixels are interconnected. Since at least some film layers (including but not limited to the hole injection layer, the hole transport layer, the electron injection layer, and the electron transport layer) of the light-emitting functional layer have a high carrier migration rate, the holes and electrons in these layers are susceptible to lateral shifts and transport to adjacent pixels, thereby resulting in crosstalk phenomena.

In OLED display technologies, a silicon-based OLED have the advantages of small size and high resolution. The silicon-based OLED adopts a mature integrated circuit CMOS process to achieve active pixel addressing with a variety of circuits such as TCON and OCP, which is conducive to lightweighting. Silicon-based OLEDs are widely used in the field of near-eye display and virtual and augmented reality, especially in AR/VR head-mounted display devices. However, the above crosstalk phenomenon is more obvious in silicon-based OLED display panels, especially white OLED (WOLED) display panels with a stacked structure. Adjacent light-emitting functional layers of WOLED display panel with a stacked structure are connected in series by a charge-generating layer. However, the charge-generating layer has a well charge conduction characteristic, which may cause crosstalk between adjacent sub-pixels and thus affect the luminescence effect.

Figure 1:
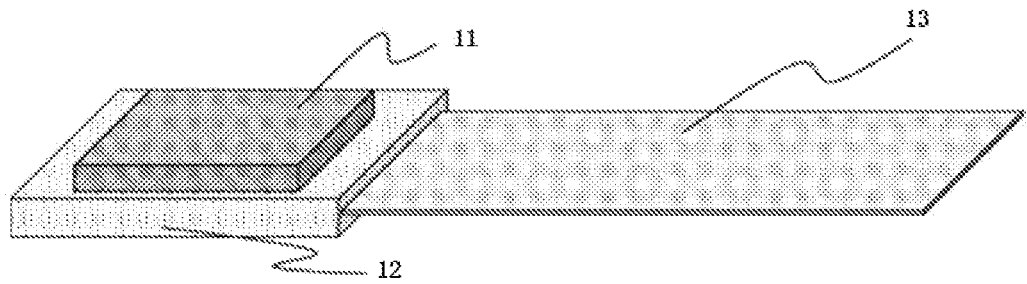
FIG. 1 schematically illustrates an example silicon-based OLED display panel.

FIG. 1 schematically illustrates an example silicon-based OLED display panel. As shown in FIG. 1, the silicon-based OLED display panel may have a flexible circuit board FPC type module structure. The silicon-based OLED display panel may include a cover plate 11, and a silicon-based backplate 12 below the cover plate, which has an OLED light-emitting device fabricated on an effective light-emitting area of the silicon-based backplate 12 to realize the color light-emitting function. The cover plate 11 is at least partially light-transmitting cover plate. A size of the cover plate 11 may be larger than a size of the effective light-emitting area of the silicon-based backplate 12 and smaller than a size of the silicon-based backplate 12 in order to protect the devices on the silicon-based backplate 12 from being damaged and to facilitate the positioning and fixing of the silicon-based OLED display panel. A pixel driver circuit is further integrated in the silicon-based backplate 12 to enable voltage input driving of the light-emitting pixels. The OLED display panel may further include a flexible circuit board 13 connected to the silicon-based backplate 12 to allow transmission of an external signal.

Figure 2:
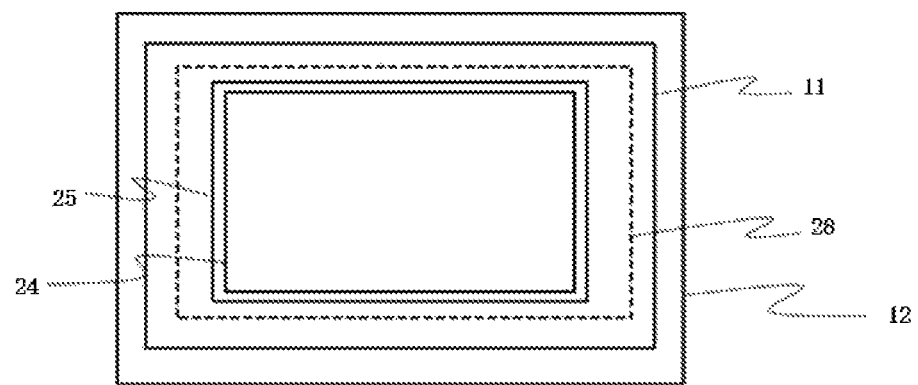
FIG. 2 schematically illustrates a top view of an example silicon-based OLED display panel.

FIGS. 2 and 3 schematically illustrate a top view and a cross-sectional view of an example silicon-based OLED display panel, respectively. As shown in FIG. 2 and FIG. 3, the silicon-based OLED display panel may include a silicon-based backplate 12, an anode 24 on the silicon-based backplate 12, a light-emitting function layer 25 on a side of the anode 24 away from the silicon-based backplate 12, a cathode 26 on a side of the light-emitting function layer 25 away from the silicon-based backplate 12, a first encapsulation layer 27 on a side of the cathode 26 away from the silicon-based backplate 12, a color film layer 28 on a side of the first encapsulation layer 27 away from the silicon-based backplate 12, a second encapsulation layer 29 on a side of the color film layer 28 away from the silicon-based backplate 12, and a cover plate 11 on a side of the second encapsulation layer 29 away from the silicon-based backplate 12. The silicon-based backplate 12 may have a pixel driver circuit integrated thereon for driving the light-emitting function layer to emit light. The pixel driver circuit may be made, for example, by a 180 nm or 110 nm semiconductor process.

In a silicon-based OLED display device, a stack of multilayer structures is typically used to achieve the high brightness and high lifetime required for the silicon-based display panel. For example, the color display of a white OLED (WOLED) display panel is achieved by using a stack of a red light-emitting function layer, a green light-emitting function layer, and a blue light-emitting function layer combined with a color film layer.

In a WOLED display panel, an intermediate layer, such as a charge-generating layer, is generally provided between the light-emitting functional layers of different colors (e.g., between the blue light-emitting functional layer and the green light-emitting functional layer) to provide carriers for the light-emitting functional layers located on either side of the intermediate layer. However, since the intermediate layer, such as the charge-generating layer, is generally a highly conductive material with a high carrier migration rate, it tends to cause electric leakage between neighboring pixels, thereby resulting in crosstalk phenomena. In addition, the hole injection layer and the hole transport layer above the intermediate layer also have a high carrier migration rate, which also tend to cause crosstalk between pixels.

FIG. 4A schematically illustrates an example WOLED display panel. FIG. 4B schematically illustrates the generation of crosstalk in a WOLED display panel. As shown in FIG. 4A, the WOLED display panel includes a blue light-emitting functional layer 41, a green light-emitting functional layer 42, and a red light-emitting functional layer 43. To provide sufficient carriers, an intermediate layer 44, such as a charge-generating layer, is provided between the blue light-emitting functional layer 41 and the green light-emitting functional layer 42. For the blue sub-pixel, under the action of the electric field between the anode 24 and the cathode 26, holes from the anode 24 and electrons from the charge-generating layer migrate to the blue light-emitting functional layer 41 and meet in the blue light-emitting functional layer 41 to emit blue light. Similarly, the green light-emitting functional layer 42 may emit green light and the red light-emitting functional layer 43 may emit red light. Blue light, green light, and red light are mixed to form white light which becomes the outgoing blue light after being filtered by the blue filter layer B above.

However, as shown in FIG. 4B, due to the high conductivity of the intermediate layer 44 between the blue light-emitting functional layer 41 and the green light-emitting functional layer 42, the carriers of the intermediate layer 44 in the blue pixel area may be laterally shifted toward the red and green pixel areas neighboring to the blue area, as indicated by the dashed arrows in FIG. 4B. This causes the ratio of red, green, and blue light of the individual pixels to be out of proportion, thus causing a crosstalk phenomenon.

The present disclosure provides a display panel that improves crosstalk by extending the first electrode (anode) to a bottom surface of a recess disposed in a backplate such that a portion of the at least one of the plurality of first electrodes is located on the bottom surface of the neighboring recess.

In some embodiments of the present disclosure, a display panel is disclosed including a backplate including a plurality of pixel areas and a plurality of recesses configured to separate the plurality of pixel areas from each other, and a plurality of first electrodes on the backplate, wherein orthographic projections of the plurality of first electrodes on the backplate partially overlap with the plurality of pixel areas, respectively, and wherein at least one of the plurality of first electrodes extends to a bottom surface of the recess neighboring to the at least one first electrode such that a portion of the at least one of the plurality of first electrodes is located on the bottom surface of the neighboring recess.

The extension of the first electrode (in particular the anode) on the bottom surface of the recess allows changing the electric field at the position of the recess so that the carriers intended to be laterally shifted are deflected upward or downward by the electric field at the position corresponding to the recess and are no longer laterally shifted to the adjacent pixels. Since the position corresponding to the recess is not an effective light-emitting area, the upward and downward deflection of carriers at this position does not affect the adjacent pixels, and thus crosstalk may be improved. In addition, the recesses in the backplate may extend the paths of carriers in the charge-generating layer, which may increase the resistance of the charge-generating layer to a certain extent, and thus also improve crosstalk.

As used herein, the term "at least one of the plurality of first electrodes" includes the case of each of the plurality of first electrodes and the case of one or more of the plurality of first electrodes. In the specific embodiments described below, the case in which each of the plurality of first electrodes extends to the bottom surface of the recess is described in detail. It should be understood, however, that embodiments in which only some of the plurality of first electrodes extend to the bottom surfaces of the recesses and some other of the first electrodes do not include portions that extend to the bottom surfaces of the recesses are also included in the present disclosure.

As used herein, the term "width" is a broad term and should be given a meaning that is ordinary and customary to one of ordinary skill in the art, and not limited to a special or customized meaning. Specifically, the term may refer to a dimension, in a first direction perpendicular to the extension direction of the recess, of a component of the display panel or a portion thereof. The term "thickness" is a broad term and should be given a meaning ordinary and customary to a person of ordinary skill in the art, and not limited to a special or customized meaning. Specifically, the term may refer to a dimension of a component of the display panel or portion thereof in a second direction perpendicular to a main surface of the component.

FIG. 5 schematically illustrates a cross-sectional view of an example display panel in one or more embodiments of the disclosure. As shown in FIG. 5, the display panel may include a backplate 52 and a plurality of first electrodes 54 on the backplate 52. The backplate 52 may include a plurality of pixel areas 521 and a plurality of recesses 522 configured to separate the plurality of pixel areas 521 from each other. Orthographic projections of the plurality of first electrodes 54 on the backplate 52 partially overlap with the plurality of pixel areas 521, respectively, and each first electrode 54 extends to a bottom surface 5221 of the recess 522 neighboring to the first electrode 54 such that a portion of the first electrode is located on the bottom surface of the neighboring recess. In one or more embodiments, each first electrode 54 may include a first conductive portion 541 on the pixel area 211 of the backplate 21 and a second conductive portion 542 covering the first conductive portion 541 and extending to the bottom surface 5221 of the recess 522 adjacent to the first conductive portion 541 such that a portion of the second conductive portion 542 is located on the bottom surface of the neighboring recess 522.

In embodiments of the present disclosure, the term "pixel area" refers to an area that may emit light to display an image. Each pixel area may have one pixel or multiple pixels.

The display panel may further include a second electrode 56 electrically isolated from the plurality of first electrodes 54 and forming, together with the first electrodes 54, an electric field that excites the light-emitting material in the light-emitting functional layer 55 to emit light. In one or more embodiments of the present disclosure, the first electrode 54 may be an anode and the second electrode 56 may be a cathode. By extending the second conductive portion 542 a width over the bottom surface 5221 of the recess 522, in addition to the electric field formed in the pixel area 521 by the first electrode 54 and the second electrode 56, an additional electric field may further be formed between the extension portion of the second conductive portion 542 on the bottom surface 5411 of the recess 522 and the second electrode 56, such that the additional electric field may deflect the laterally shifted carriers upward or downward thereby preventing the carriers from moving to adjacent pixels and thus improving the crosstalk phenomenon. It will be appreciated that the additional electric field may be an extension of the electric field in the pixel area toward a region correspond the recess in one or more embodiments of the present application. That is the additional electric field and the electric field in the pixel area may together form a larger continuous electric field.

FIG. 6 schematically illustrates another cross-sectional view of a display panel in one or more embodiments of the present disclosure. As shown in FIG. 6, the display panel may include a backplate 52 having a plurality of pixel areas 521 and a plurality of recesses 522 separating the plurality of pixel areas 521 from each other, a plurality of first electrodes 54 on the backplate 52, a pixel definition layer 61 on a side of the plurality of first electrodes 54 away from the backplate 52, a light-emitting functional layer 55 on a side of the pixel definition layer 61 away from the backplate 52, and a second electrode 56 on a side of the light-emitting functional layer 55 away from the backplate 52. In one or more embodiments of the present disclosure, each of the first electrodes 54 may extend to the bottom surface 5221 of the recess 522 neighboring to that first electrode 54, such that a portion of the first electrode 54 is located on the bottom surface of the neighboring recess. The pixel definition layer 61 may divide the light-emitting functional layer 55 into sub-areas corresponding one-to-one to the plurality of first electrodes 54, wherein each sub-area and the corresponding first electrode 54 and a portion of the second electrode 56 corresponding to the sub-area form a light-emitting device. In this way, a plurality of light-emitting devices may be defined by the pixel definition layer 61.

According to an embodiment of the present disclosure, an additional electric field may be generated between the portion of the first electrode 54 located on the bottom surface 5221 of the recess 522 and the second electrode 56, such that the additional electric field may deflect the laterally shifted carriers in the light-emitting functional layer 55 upward or downward, thereby preventing the carriers from shifting to adjacent pixels and thus improving crosstalk.

In some embodiments of the present disclosure, as shown in FIG. 6, the backplate 52 may have a plurality of driver transistors 523 integrated thereon for driving the respective light-emitting devices to emit light. As an example, the backplate 52 may include a substrate 524, a plurality of driver transistors 523 disposed on the substrate 524, and an insulating layer 525 between the driver transistors 523 and the first electrodes 54. In some embodiments of the present disclosure, a material of the substrate 524 may be a semi-conductor material such as monocrystalline silicon or polycrystalline silicon. In an alternative embodiment, the substrate 524 may also be made of other hard or soft materials such as glass, plastic, etc. The driver transistor 523 may be electrically connected directly or indirectly to the first electrode 54 through one or more vias 526 arranged in the insulating layer.

In some embodiments of the present disclosure, a material of the insulating layer 525 may include, for example, at least one of silicon nitride and or silicon oxide. The plurality of recesses 522 may be arranged in the insulating layer 525 of the backplate 52. A depth of the recess 522 may be less than a depth of the insulating layer 525. The backplate 52 may be divided into a plurality of pixel areas 521 separated from each other, and the plurality of pixel areas 521 may correspond to the plurality of light-emitting devices defined by the pixel definition layer 61 one by one.

In some embodiments of the present disclosure, each recess 522 may include two sidewalls 5222 and a bottom surface 5221 connecting the two sidewalls 5222. The two sidewalls 5222 may have an intersection angle therebe-tween, i.e., their extending surfaces may intersect. In an example embodiment, an intersection line of the extending surfaces of the two sidewalls 5222 may be on a side of the bottom surface 5221 of the recess 522 away from an opening of the recess 522, i.e., below the bottom surface 5221 of the recess 522 in the case of the orientation shown in the figures, so that the cross-section of the recess 522 in a direction perpendicular to an extension direction of the recess 522 is an orthorapezoid, in particular an isosceles orthotrapezoid. In the embodiment shown in FIG. 6, the bottom surface 5221 of the recess 522 is substantially flat in a plane parallel to the substrate. It will be appreciated that the bottom surface 5221 of the recess 522 may also be a curved surface, for example, a curved surface that protrudes toward a direction away from the substrate 524.

In some embodiments of the present disclosure, some of the plurality of recesses 522 may be arranged spaced apart in a first direction and extend in a second direction perpen-dicular to the first direction, and some other of the plurality of recesses 522 may be arranged spaced apart in the second direction and extend in the first direction. With this configu-ration, the plurality of recesses 522 may divide the backplate 52 into a plurality of pixel areas 521 arranged in array, for subsequently forming individual light-emitting devices on the individual pixel areas 521. In an alternative embodiment, all of the plurality of recesses 522 may be arranged spaced apart in only the first direction or the second direction to form pixel areas each with an elongated strip shape.

In some embodiments, depending on the different exten-sion directions of the recesses 522, a shape of an ortho-graphic projection of the pixel area 521 on the substrate 524 may be rectangular, pentagonal, hexagonal, or other polygo-nal. Of course, it may also be circular or other shapes, which are not specifically limited herein. Also, the shapes and sizes of the different pixel areas may be different.

With continued reference to FIG. 6, in some embodiments of the present disclosure, each first electrode 54 may include a first conductive portion 541 on the pixel area 521 of the backplate 52, and a second conductive portion 542 covering the first conductive portion 541 and extending to a bottom surface 5221 of the recess 522 neighboring to the first conductive portion 541 such that a portion with a width L, of the second conductive portion 542 is located on the bottom surface 5221 of the neighboring recess 522. Each second conductive portion 542 may include an intermediate portion 5421 on the first conductive portion 541, an exten-sion portion 5422 on the bottom surface 5221 of the recess 522, and a connecting portion 5423 connecting the interme-diate portion 5421 and the extension portion 5422. In some embodiments of the present disclosure, a width of the extension portion 5422 in a first direction parallel to the bottom surface 5221 of the recess 522 and perpendicular to the extension direction of the recess 522 is equal to ⅙ to ⅓ of a width in the first direction, of the bottom surface of the recess where the extension portion is located. In particular, the width L of the extension portion 5422 may be equal to ⅙, ⅕, ¼, ⅓ of the width D of the bottom surface 5221 of the recess 522 or an intermediate value between any two of these values. By the configuration of the specific width of the extension portion 5422, it is possible to create an additional electric field between the extension portion 5422 and the second electrode 56 wide enough to deflect the carriers in the vertical space corresponding to the recess 522, in order to prevent the carriers from shifting to the neigh-boring pixels, and at the same time to avoid the occurrence of a short circuit between adjacent second conductive por-tions 542. On the other hand, the extension of the second conductive portion 542 into the recess enables the first conductive portion 541 to be completely surrounded, so that the second conductive portion 542 may provide protection to the first conductive portion 541 from adverse effects caused by the external environment or subsequent layer fabrication. The second conductive portion 542 may further act as a shield to the first conductive portion 541 to prevent the influence of the first conductive portion 541 on the electric field.

By way of example, the recess 522 (specifically, the bottom surface 5221 of the recess 522) may have a width of 0.4 to 0.6 μm in the first direction perpendicular to the extension direction of the recess 522, and the extension portion 5422 of the second conductive portion 542 may have a width of, for example, 0.05 to 0.15 μm. For example, the width of the recess 522 may be 0.5 μm and the width of the extension portion 5422 may be 0.1 μm.

With continued reference to FIG. 6, a slope of a side of a first conductive portion 541 may be the same as a slope of the sidewall 5222 of the recess adjacent to the side, and the side of the first conductive portion 541 and the sidewall 5222 of the recess adjacent to the side are coplanar. In the embodiment, the connecting portion 5423 of the second conductive portion 542 may conformally cover the side of the first conductive portion 541 and the sidewall 5222 of the recess 522. In the embodiment, an inclination angle of the connecting portion 5423 of the second conductive portion 542 with respect to the extension portion 5422 of the second conductive portion 542 may be substantially equal to an inclination angle of the sidewall 5222 of the recess 522 where the connecting portion 5423 is located 5222 with respect to the bottom wall 5221. However, in practice, due to process conditions and other limitations, the connecting portion 5423 may have an uneven thickness, for example, the thickness of the connecting portion 5423 may gradually thicken from an end near the intermediate portion 5421 toward another end near the extension portion 5422. In this case, the inclination angle of the connecting portion 5423 with respect to the extension portion 5422 may be expressed as the inclination angle of an outer surface of the connecting portion 5423 (i.e., the surface facing the recess) with respect to the extension portion 5422. In some embodiments of the present disclosure, the inclination angle of the connecting portion 5423 with respect to the extension portion 5422 may be 80° to 120°, for example, 80°, 90°, 95°, 100°, 110°, 120°, or an intermediate value between any two of these values.

As used herein, the term "side of the first conductive portion" refers to a surface of the first conductive portion that is not parallel to the bottom surface of the recess. The term "conformally" refers to an upper layer maintaining substantially the same shape as a lower layer on which the upper layer is located.

With continued reference to FIG. 6, the first conductive portion 541 may include a first layer 5411 within the pixel area 541 of the backplate 52, a second layer 5412 on the first layer 5411, and a third layer 5413 on the second layer 5412. In an example embodiment, the first layer 5411 may include titanium (Ti), the second layer 5412 may include aluminum (Al), and the third layer 5413 may include titanium (Ti) or titanium nitride (TiNx). Using Ti as the first layer 5411 of the first conductive portion 541 may increase the adhesion between the first conductive portion 541 and the backplate 52. Alternatively, the first conductive portion 541 may include only two layers, for example, a first layer formed of Ti material and a second layer formed of Ag material. In some embodiments, a material of the second conductive portion 542 may include a light-transmitting material, e.g., indium tin oxide (ITO).

In one or more embodiments of the present disclosure, a thickness of the first conductive portion 541 in a second direction perpendicular to the backplate 52 may be substantially equal to 1.5 times to 2.5 times, for example, 2 times, a minimum depth of the recess 522 in the second direction.

In other embodiments, the thickness of the first conductive portion 541 may be substantially equal to 6 times to 8 times a thickness of the second conductive portion 542. A thickness of the second layer 5412 of the first conductive portion 541 is substantially equal to 2 to 4 times, in particular, 3 times, a sum of a thickness of the first layer 5411 and a thickness of the third layer 5411. The thickness of the first layer 5411 of the first conductive portion 541 is substantially equal to 0.5 to 1.5 times, in particular, 3 times, the thickness of the second conductive portion 542 in the second direction.

By way of example, the thickness of the first conductive portion 541 may be about 800 A, wherein the thickness of the first layer 5411 is about 120 A, the thickness of the second layer 5412 is about 600 A, and the thickness of the third layer 5413 is about 80 A, the thickness of the second conductive portion 542 is about 120 A, and the depth of the recess 522 is of about 400 A.

As already described above, the side of the first conductive portion 541 and the sidewall 5222 of the recess 522 may be coplanar. However, it is understood that the side of the first conductive portion 541 may be offset by a certain distance relative to the sidewall 5222 of the recess 522 adjacent to the side. That is, a distance from the side of the first conductive portion 541 to a plane in which the sidewall 5222 of the recess 522 nearest the side is located may not be 0. As an example, the distance from the side of the first conductive portion 541 to the plane in which the sidewall 5222 of the recess 522 nearest the side is located may be greater than 0 and less than the thickness of the first conductive portion 541. The distance from the side of the first conductive portion 541 to the plane in which the sidewall 5222 of the recess 522 nearest to the side is located may be less than ⅕, ½, or ⅘ of the thickness L1 of the first conductive portion 541. In the embodiment, since the distance from the side of the first conductive portion 541 to the sidewall 5222 of the recess 522 is relatively small such that the first electrode 54 may occupy a larger area, so the opening rate of the display panel may be increased.

In some other embodiments, the slope of the side of the first conductive portion 541 and the slope of the sidewall 5222 of the recess 522 may be different. In other embodiments, the side of the first conductive portion 541 may not be planar, but may be, for example, a fold surface formed by at least two planes having different slopes.

FIG. 14 schematically illustrates a first conductive portion with a non-planar side and a recess corresponding thereto in one or more embodiments of the present disclosure. As shown in FIG. 14, the side of the first conductive portion 541 may be non-planar. Specifically, the side of the first conductive portion 541 may include a first inclined face 5401 adjacent to the recess 522 and a second inclined face 5402 intersecting the first inclined face 5401 and away from the recess 522, a slope of the first inclined face 5401 being less than a slope of the second inclined face 5402 such that an angle α between the first inclined face 5401 and the second inclined face 5402 is an obtuse angle, and an angle β between the first inclined face 5402 and a surface of the backplate 52 where the first conductive portion 541 is located is an acute angle.

In some embodiments of the present disclosure, the first inclined face 5401 may be a side of the first layer 5411 of the first conductive portion 541, and the second inclined face 5402 may be a surface formed by a side of the second layer 5412 and a side of the third layer 5413 together.

It is noted that the first inclined face and the second inclined face are illustrated as planar in FIG. 14, but it is understood that the first inclined face and the second inclined face may also be curved. In the latter case, the slopes of the first inclined face and the second inclined face may refer to the minimum slopes of the first inclined face and the second inclined face.

The first conductive portion 541 typically is formed by first forming a first conductive layer using a material of the first conductive portion and then patterning the first conductive layer using an etching process (e.g., dry etching). During dry etching, it is difficult to form sides with the same slope and aligned with each other for different layers of the first conductive portion due to process conditions, thus resulting in a non-planar side structure of the first conductive portion. The side profile of the first conductive portion in the embodiment shown in FIG. 14 may reduce the process requirements in forming the first conductive portion and thus facilitate to improve the preparation efficiency of the display panel.

During the preparation of the display panel, the first conductive portion 541 and the recess 522 on the backplate 52 are generally formed simultaneously in a single patterning (e.g., etching). However, because the material forming the first conductive portion 541 is different from the material forming the backplate 52 (particularly the insulating layer on the backplate), during continuing to etch the insulating material of the backplate after etching the first conductive layer formed by the material of the first conductive portion, an inner recessed structure may be formed near the interface between the first conductive portion 541 and the backplate 52.

As shown in FIG. 14, the sidewall 5222 of the recess 522 has an inner recessed structure 52221 recessed toward an interior of the backing plate 52 and located at a position of the sidewall 5222 of the recess 522 that is in proximity to the first conductive portion 541. In some embodiments, a depth of the inner recessed structure 52221 is less than a width of the orthographic projection of the first inclined face 5401 on the backplate 52. With this configuration, it is possible to reduce the process requirements in forming the first conductive portion 541 and the recess 522, which is conducive to improving the preparation efficiency of the display panel.

The second conductive portion 542 is typically formed by first forming a second conductive layer using a material of the second conductive portion and then patterning the second conductive layer using an etching process (e.g., dry etching). In some embodiments of the present disclosure, in order to avoid a short circuit of the second conductive portion caused by undesired material of the second conductive layer remaining on the bottom of the recess, the second conductive layer may be over-etched, i.e., the etching depth extends into the material of the backplate, to form a sub-recess in the bottom of the recess.

In an embodiment of the present disclosure, the connecting portion 5423 of the second conductive portion 542 may conformally cover the side of the first conductive portion 541 and the sidewall of the recess. That is, the connecting portion 5423 of the second conductive portion 542 may not be planar and may have a shape consistent with a surface formed by the side of the first conductive portion and the side wall of the recess together. Specifically, the connecting portion 5423 of the second conductive portion 542 may include a first portion corresponding to the first inclined face 5401 and a second portion corresponding to the second inclined face 5402, and the connecting portion 5423 also has a depression toward the inner recessed structure 52221 at the location of the inner recessed structure 52221 of the recess 522. In order not to cause confusion, the second conductive portion 541 is not shown in FIG. 14, and an optional structure of the second conductive portion 542 may be referred to FIG. 15.

It is noted that the inner recessed structure is illustrated in FIG. 14 as having a triangular cross-section, but it is understood that the cross-sectional shape of the inner recessed structure is not limited thereto, and that it may have other regular or irregular shapes. For example, the cross-sectional shape of the inner recessed structure may be a circular arc. FIG. 15 schematically illustrates a recess having a sub-recess and the corresponding first conductive portion and second conductive portion in one or more embodiments of the present disclosure. As shown in FIG. 15, the bottom surface 5221 of the recess 522 has a sub-recess 52211. In some embodiments, a width of the sub-recess 52211 is substantially equal to a distance between adjacent extension portions 5422 in a same recess, of the adjacent second conductive portion 542, i.e., the width of the sub-recess 52211 is substantially equal to the width of the portion of the bottom surface 5221 of the recess 522 that is exposed by the adjacent extension portions 5422 of the adjacent second conductive portion 542. In some embodiments, a depth of the sub-recess 52211 is not greater than $1/3$, in particular $1/5$, and more particularly $1/10$ of the minimum depth of the recess 522. By the configuration of the sub-recess, it is possible to reduce the process requirements in forming the second conductive portion 542, which is conducive to improving the preparation efficiency of the display panel.

Referring back to FIG. 6, the pixel definition layer 61 has an opening 610 for defining a pixel to expose a portion of the intermediate portion 5421 of the second conductive portion 542. The portion of the intermediate portion 5421 of the second conductive portion 542 that is exposed by the pixel definition layer 61 may form a light-emitting device together with a portion of the light-emitting functional layer 55 corresponding to the exposed portion of the intermediate portion 5421 and a portion of the second electrode 56 corresponding to the exposed portion of the intermediate portion 5421. The pixel definition layer 61 may include a plurality of pixel definition units 611 that may be connected to each other to define a plurality of openings 610 for defining the pixels. Each pixel definition unit 611 includes a first recessed portion 6111 in the recess 522 and a first flat portion 6112 on either side of the first recessed portion 6111 and covering an additional portion of the intermediate portion 5421 that is not exposed by the opening 6112. The first recessed portion 6111 may include a sidewall portion 61112 covering the connecting portion 5423 and a bottom 61111 on the bottom surface 5221 of the recess 522 and the extension portion 5422 of the second conductive portion 542.

In embodiments where the recess 522 has a sub-recess 52211 on the bottom surface 5221, the pixel definition layer 61 may fill the sub-recess 52211 and the thickness of a portion of the pixel definition layer 61 corresponding to the sub-recess 52211 is greater than the depth of the sub-recess 52211 and the thickness of the extension portion 5422 of the second conductive portion 542. As an example, the thickness of the portion of the pixel definition layer 61 corresponding to the sub-recess 52211 is equal to a sum of the depth of the sub-recess 52211, the thickness of the extension portion 5422 of the second conductive portion 542, and the thickness of the first flat portion 6112 of the pixel definition layer 61.

In an embodiment of the present disclosure, the sidewall portion 61112 of the first recessed portion 6111 may have the same inclination angle as the connecting portion 5423 of the second conductive portion 542. However, due to limitations such as a manufacturing process, when preparing the pixel definition layer 61, the resulting sidewall portion 61112 may have an uneven thickness due to, for example, the fluidity of the material, etc. For example, the thickness at a location of the sidewall portion 61112 near the bottom 61111 may be greater than the thickness at a location away from the bottom 61111. In the case, the inclination angle of the sidewall portion 61112 with respect to the bottom 61111 may be greater than the inclination angle of the connecting portion 5423 of the second conductive portion 541 with respect to the extension portion 5422. In an example embodiment, the inclination angle of the sidewall portion 61112 with respect to the bottom 61111 may be 85° to 125°, and the inclination angle of the connecting portion 5423 with respect to the extension portion 5422 may be 80° to 120°. In a specific embodiment, the inclination angle of the sidewall portion 61112 with respect to the bottom 61111 may be 105°, and the inclination angle of the connecting portion 5423 with respect to the extension portion 5422 may be 100°.

In some embodiments of the present disclosure, the width of the first flat portion 6112 of the pixel definition layer 61 on the intermediate portion 5421 may be no greater than $\frac{1}{10}$ of the width of the intermediate portion 5421 to have a sufficiently high opening ratio. In a particular embodiment, the width of the first flat portion 6112 of the pixel definition layer 61 on the intermediate portion 5421 may be equal to $\frac{1}{20}$ to $\frac{1}{10}$ of the width of the intermediate portion 5421. By way of example, the width of the first flat portion 6112 of the pixel definition layer 61 may be about 0.15 μm. In some embodiments of the present disclosure, the thickness of the pixel definition layer 61 (specifically, the thickness of a portion of the pixel defining layer 61 on the second conductive portion 542) may be equal to $\frac{1}{4}$ to $\frac{1}{2}$ of the thickness of the first conductive portion 541. By way of example, the thickness of the pixel defining layer 61 may be between 70 nm and 140 nm. In some embodiments of the present disclosure, the material of the pixel definition layer 61 may include one or more of silicon oxide, silicon nitride, and silicon nitride oxide.

With continued reference to FIG. 6, the light-emitting functional layer 55 may be located on a side of the pixel definition layer 61 away from the backplate 52, and the second electrode 56 may be located on a side of the light-emitting functional layer 55 away from the backplate 52. The light-emitting functional layer 55 may be a continuous film layer, which may be formed by a process such as vapor deposition.

In some embodiments of the present disclosure, the light-emitting functional layer 55 may include a hole injection layer HIL, a hole transport layer HTL, an organic light-emitting layer EL, an electron transport layer ETL, and an electron injection layer EIL between the first electrode 54 and the second electrode 56. As already described above, since the hole injection layer HIL, the hole transport layer HTL, the electron transport layer ETL, the electron injection layer EIL generally have high carrier mobility, the holes and electrons in these layers are prone to lateral shift to transfer to toward adjacent pixels, thereby generating crosstalk.

FIG. 7A illustrates a schematic diagram of crosstalk generation in a display panel in the related technology. As shown in FIG. 7A, due to the high carrier mobility, a portion of the holes 72 in the hole injection layer HIL and the hole transport layer HTL and a portion of the electrons 71 in the electron transport layer ETL and the electron injection layer EIL may break free from the electric field between the first electrode 541 and the second electrode 542 and shift laterally to the adjacent pixels, thus generating crosstalk.

FIG. 7B illustrates a schematic diagram of crosstalk suppression of a display panel according to an embodiment of the present disclosure. As shown in FIG. 7B, the area where the recess 522 is located is typically not a display area of the display panel, and a black matrix 58 is typically provided in the color film layer 57 at a location corresponding to the recess. According to the display panel provided in embodiments of the present disclosure, the first electrode 54, in particular the second conductive portion 542, extends to the bottom surface of the recess 522 such that the extension portion 5422 of the second conductive portion 542 over the bottom surface of the recess 522 and the second electrode 56 generate an electric field in an area corresponding to the recess 522 (which area corresponds to the non-illuminated area of the display panel), such that the additional electric field may enable carriers intended to be laterally shifted to deflect upward or downward, so that lateral shift to neighboring pixels may be avoided, thus improving the crosstalk phenomenon.

In some other embodiments of the present disclosure, the light-emitting functional layer may include a plurality of light-emitting functional sublayers arranged in a stack, and each light-emitting functional sublayer may include a hole injection layer HIL, a hole transport layer HTL, an organic light-emitting layer EL, an electron transport layer ETL, and an electron injection layer EIL. FIG. 8A illustrates a schematic diagram of crosstalk generation in a display panel having a stacked arrangement of light-emitting functional layers in the related art. As shown in FIG. 8, the light-emitting function layer 55 may include a first light-emitting function sublayer 551, a second light-emitting function sublayer 552, and a third light-emitting function sublayer 553 arranged in a stack. The first light-emitting function sublayer 551 is configured to emit light of a first color (blue), the second light-emitting function sublayer 552 is configured to emit light of a second color (green), and the third light-emitting function sublayer 553 is configured to emit light of a third color (red). To improve the performance of the display panel, a charge generation layer CGL may further be provided between at least two of the light-emitting function sublayers (for example, between the blue light-emitting function sublayer and the green light-emitting function sublayer). The charge generation layer CGL may generate electrons 71 and holes 72 which are combined in the organic light-emitting layer EL with the holes 72 injected from the first electrode 54 and the electrons 71 injected from the second electrode 56, respectively, to emit light.

As shown in FIG. 8A, for a display panel having a stacked arrangement of light-emitting functional layers 55, in addition to a portion of charge carriers that may be laterally shifted in the hole injection layer HIL, the hole transport layer HTL, the electron transport layer ETL, and the electron injection layer EIL, carriers generated by the charge generation layer CGL may also be laterally shifted to adjacent pixels and cause crosstalk. Therefore, the crosstalk phenomenon may be more pronounced in a display panel having a stacked arrangement of light-emitting functional layers 55.

FIG. 8B illustrates a schematic diagram of crosstalk suppression of a display panel having a stacked arrangement of light-emitting functional layers according to an embodiment of the present disclosure. As shown in FIG. 8B, according to the display panel provided in the embodiment of the present disclosure, the first electrode 54, in particular the second conductive portion 542, extends to the bottom surface 5221 of the recess 522 such that the extension portion 5422 of the second conductive portion 542 and the second electrode 56 generate an additional electric field in the area corresponding to the recess 522 (which area corresponds to the non-illuminated area of the display panel), such that the additional electric field not only enables electrons 71 and holes 72 intended to be laterally shifted in the hole injection layer HIL, the hole transport layer HTL, the electron transport layer ETL, and the electron injection layer EIL to deflect, but also enables electrons 71 and holes 72 intended to be laterally shifted in the charge generation layer CGL to deflect, so that the lateral shift of carriers to neighboring pixels may be avoided, thus improving the crosstalk phenomenon.

Referring back to FIG. 6, the second electrode 56 may be substantially flat in a plane parallel to the substrate 52. The second electrode 56 may be made of a metal or a metal alloy. As an example, the second electrode 56 may be made of any of Mg, Ag, Al, and Li or an alloy thereof. It will be appreciated that the second electrode 56 may also be made of other alloys or monolithic metals.

In some embodiments of the present disclosure, as shown in FIG. 6, the display panel may further include a first encapsulation layer 62, a color film layer 57, a second encapsulation layer 63, and a transparent cover 64.

The first encapsulation layer 62 is disposed on and covers the second electrode 56. The first encapsulation layer 62 may include a plurality of first encapsulation sublayers. As an example, the first encapsulation layer 62 may include two inorganic layers and an organic layer between the two inorganic layers.

The color film layer 57 is disposed on the side of the first encapsulation layer 62 away from the second electrode 56. The color film layer 57 may include a plurality of color filter areas distributed in an array corresponding to the plurality of first electrodes 54, such as red filter area 571, green filter area 572, and blue filter area 573. These color filter areas may be separated by a black matrix 58.

The second encapsulation layer 63 may cover the color film layer 57. The second encapsulation layer 63 may include a plurality of second encapsulation sublayers. As an example, the second encapsulation layer 63 may include an inorganic layer and an organic layer.

The transparent cover 64 may cover the second encapsulation layer 63. The transparent cover 64 may include glass or a transparent polymer material.

FIG. 9 schematically illustrates a cross-sectional view of an alternative display panel in one or more embodiments of the present disclosure. The display panel illustrated in FIG. 9 shares some similarities with the display panel illustrated in FIG. 6, and the description provided relative to FIG. 6 applies, as appropriate, to the display panel illustrated in FIG. 9. Accordingly, in the following description, only portions that differ from the embodiment illustrated in FIG. 6 are described, and portions that are identical to the embodiment illustrated in FIG. 6 are omitted.

As shown in FIG. 9, unlike the embodiment illustrated in FIG. 6 in which the second electrode is substantially flat, the second electrode in this embodiment may be recessed in a direction toward the substrate at locations corresponding to the plurality of recesses. The second electrode 56 may include a plurality of second recessed portions 561 and a plurality of second flat portions 562 arranged alternately with the plurality of second recessed portions 561. In an example embodiment, the plurality of second recessed portions 561 correspond to the plurality of recesses 522, and the orthographic projection of each second recessed portion 561 on the substrate 524 at least covers the orthographic projection of the corresponding recess 522 on the substrate 524, and the plurality of second flat portions 562 correspond to the plurality of first electrodes 54 and the orthographic projection of each second flat portion 562 on the substrate 524 is located within the orthographic projection of the corresponding first electrode 54 on the substrate 524. In an example embodiment, the width of the orthographic projection of each second recessed portion 561 on the substrate 524 is greater than the width of the orthographic projection of the corresponding recess 522 on the substrate 524 but less than the width of the orthographic projection of each pixel definition unit 611 of the pixel definition layer 61 on the substrate 524, and the width of the orthographic projection of each second flat portion 562 on the substrate 524 is less than the width of the corresponding first electrode 54 (specifically, the second conductive portion 542 of the first electrode 54) on the substrate 524. With this configuration, a stronger electric field may be generated between the second electrode 56 and the extension portion 542 of the first electrode 54, such that the laterally deflected carriers are deflected upward or downward.

FIG. 10 schematically illustrates a cross-sectional view of yet another display panel in one or more embodiments of the present disclosure. The display panel illustrated in FIG. 10 shares some similarities with the display panel illustrated in FIG. 6, and the description provided relative to FIG. 6 applies, as appropriate, to the display panel illustrated in FIG. 9. Accordingly, in the following description, only portions that differ from the embodiment illustrated in FIG. 6 are described, and portions that are identical to the embodiment illustrated in FIG. 6 are omitted.

As shown in FIG. 10, unlike the embodiment illustrated in FIG. 6 in which the recess 522 has an orthotrapezoidal cross-section in the direction perpendicular to the extension direction of the recess, in this embodiment, the recess 522 has a cross-section in the direction perpendicular to the extension direction of the recess that may be an inverted trapezoid, in particular, an isosceles inverted trapezoid. Specifically, the intersection line of the extending surfaces of the two sidewalls 5222 of the recess 522 may be located on the side of the bottom surface 5221 of the recess 522 facing the opening of the recess 522, i.e., above the bottom surface 5221 of the recess 522 in the case of the orientation shown in the figures, so that the cross-section of the recess 522 in the direction perpendicular to the extension direction of the recess 522 is an inverted trapezoid cross-section.

It will be appreciated that the cross-sectional shape of the recess 522 is not limited to the cross-sectional shape shown in the accompanying drawings, but may be other shapes as well. In an example embodiment, the two sidewalls 5222 of the recess 522 may be parallel to each other to form a recess 522 having a rectangular cross-section. In another example embodiment, the cross-sectional shape of the recess 522 may be a right-angle trapezoid. It is appreciated that the cross-sectional shape of the first recessed portion 6111 of the pixel definition layer 61 may substantially the same as the cross-sectional shape of the recess 522.

Embodiments of the present disclosure further provide a display device including a display panel according to one or more embodiments of the present disclosure, such as at least one display panel of one or more embodiments disclosed in detail above. Thus, for example embodiments of the display panel, reference may be made to embodiments of the display device. FIG. 11 schematically illustrates a display device according to one or more embodiments of the present disclosure. As shown in FIG. 11, the display device 110 may include a display panel 111 and a drive circuit 112 that provides drive signals for driving the display panel.

In yet another aspect of the present disclosure, a method for preparing a display panel is further disclosed. The method may prepare at least one display panel according to the present disclosure, such as at least one display panel according to one or more of the embodiments disclosed in detail above. Thus, for optional embodiments of the method, reference may be made to embodiments of the display panel. The method may include the following steps, which may be performed in a given order or in a different order. In addition, additional method steps not listed may be provided. In addition, two or more or even all of the method steps may be performed at least partially simultaneously. In addition, the method steps may be repeated twice or even more than twice.

FIG. 12 schematically illustrates a flow chart of a method for preparing a display panel in one or more embodiments of the present disclosure. FIGS. 13A-13E are schematic diagrams showing a process for preparing a display panel in one or more embodiments of the present disclosure. As shown in FIG. 12, the method may include steps S122, S124, S126, S128, S130.

Figures 13A, 13B, 13C, 13D, 13E:
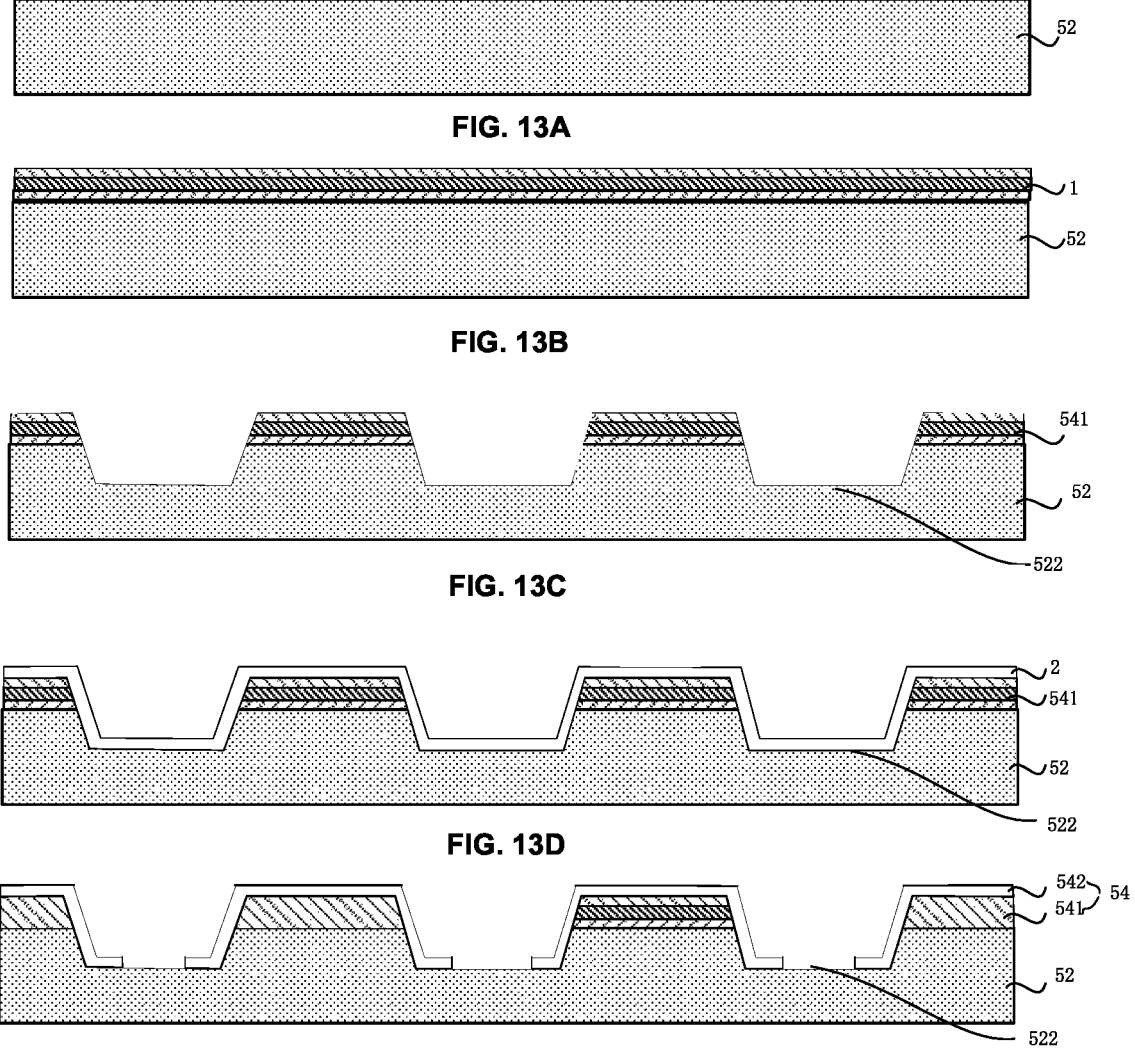

At step S122, a backplate 52 is provided (as shown in FIG. 13A). The backplate 52 may include a substrate 524, a plurality of driver transistors 523 disposed on the substrate 524, and an insulating layer 525 disposed between the driver transistors 523 and the first electrode 54. The material of the substrate 524 may be a semiconductor material such as monocrystalline silicon or polycrystalline silicon. The material of the insulating layer 525 may include, for example, at least one of silicon nitride or silicon oxide.

At step S124, a first conductive layer is formed on the backplate 52 (as shown in FIG. 13B). The first conductive layer may include a first layer, a second layer and a third layer. The first layer may include titanium (Ti), the second layer may include aluminum (Al), and the third layer may include titanium (Ti) or titanium nitride (TiNx).

At step S126, the first conductive layer and the backplate 52 are patterned to form a plurality of first conductive portions 541 and a plurality of recesses 522 (as shown in FIG. 13C). Each first conductive portion includes a first layer, a second layer and a third layer. The plurality of recesses 522 separate the backplate 52 into a plurality of pixel areas 521, and the plurality of first conductive portions 541 are located on the plurality of pixel area 521, respectively. In some embodiments of the present disclosure, the recess 522 may be located in the insulating layer of the backplate 52 and the depth of the recess 522 may be less than the depth of the insulating layer.

At step S128, a second conductive layer is formed on the plurality of first conductive portions 541 and in the recesses 522 (as shown in FIG. 13D). The material of the second conductive layer may include, for example, indium tin oxide (ITO).

At step S130, the second conductive layer is patterned to form a plurality of second conductive portions 542 (as shown in FIG. 13E, wherein each of the plurality of second conductive portions 542 covers the first conductive portion 541 and extends to the bottom surface 5221 of the recess 522 neighboring to the first conductive portion 541 such that a portion of the second conductive portion 542 is located on the bottom surface of the neighboring first conductive portion 541.

By having the second conductive portion 542 extend a width over the bottom surface 5221 of the recess 522, in addition to the electric field formed in the pixel area by the first electrode 54 and the second electrode 56, an additional electric field may also be formed between the extension portion 5422 of the second conductive portion 542 on the bottom surface 5221 of the recess 522 and the second electrode 56, such that the additional electric field enables the laterally deflected carriers to deflect upward or downward thereby preventing the carriers from moving between pixels and thus improving the crosstalk phenomenon.

The foregoing description of the embodiment has been provided for purpose of illustration and description. It is not intended to be exhaustive or to limit the application. Individual elements or features of a particular embodiment are generally not limited to that particular embodiment, but, where applicable, are interchangeable and may be used in a selected embodiment, even if not specifically shown or described. The same may also be varied in many ways. Such variations are not to be regarded as a departure from the application, and all such modifications are included within the scope of the application.

There are various refinements of the noted features related to the above aspects of the present disclosure. Further features may also be incorporated into the above-described aspects of the present disclosure. These refinements and additional features may exist individually or in any combination. For example, the various features discussed above in connection with any illustrative embodiment of the present disclosure may be incorporated into any of the foregoing aspects of the present disclosure, either alone or in any combination.

What is claimed is:

1. A display panel comprising:

a backplate comprising a plurality of pixel areas and a plurality of recesses configured to separate the plurality of pixel areas from each other; and a plurality of first electrodes on the backplate, wherein orthographic projections of the plurality of first electrodes on the backplate partially overlap the plurality of pixel areas, respectively, and wherein at least one of the plurality of first electrodes extends to a bottom surface of the recess neighboring the first electrode such that a portion of the at least one of the plurality of first electrodes is located on the bottom surface of the neighboring recess, wherein at least one of the plurality of first electrodes comprises:

a first conductive portion on the pixel area of the backplate; and a second conductive portion covering the first conductive portion and extending to the bottom surface of the recess neighboring to the first conductive portion such that a portion of the second conductive portion is located on the bottom surface of the recess, wherein the second conductive portion comprises an intermediate portion on the first conductive portion, an extension portion on the bottom surface of the recess, and a connecting portion connecting the intermediate portion and the extension portion, wherein the connecting portion covers a side of the first conductive portion and a sidewall of the recess, and wherein the OLED display panel further comprises a pixel definition layer having an opening exposing a portion of the intermediate portion of the second conductive portion, wherein the pixel definition layer comprises a plurality of pixel definition units, each pixel definition unit comprising a first recessed portion in the recess and a first flat portion on either side of the first recessed portion, wherein the first recessed portion comprises a sidewall portion covering the connecting portion and a bottom on the bottom surface of the recess and the extension portion of the second conductive portion, and wherein the first flat portion covers another portion of the intermediate portion that is not exposed by the opening.

2. The display panel according to claim 1, wherein extending surfaces of two sidewalls of the recess intersect and wherein i) an intersection line of the extending surfaces of the two sidewalls is located on a side of the bottom surface of the recess opposite an opening of the recess or ii) on a side of the bottom surface of the recess facing the opening of the recess.

3. The display panel according to claim 1, wherein a slope of a side of the first conductive portion is the same as a slope of a sidewall of the recess adjacent to the side.

4. The display panel according to claim 3, wherein the side of the first conductive portion and the sidewall of the recess adjacent to the side are coplanar.

5. The display panel according to claim 1, wherein a slope of a side of the first conductive portion is less than a slope of a sidewall of the recess adjacent to the side.

6. The display panel according to claim 1, wherein a side of the first conductive portion is non-planar, and comprises a first inclined face and a second inclined face, wherein a slope of the first inclined face is less than a slope of the second inclined face, wherein an angle formed by the first inclined face and the second inclined face is an obtuse angle, and wherein an angle formed by the first inclined face and a surface of the backplate where the first conductive portion is located is an acute angle.

7. The display panel according to claim 6, wherein the first conductive portion comprises a first layer on the backplate, a second layer on the first layer, and a third layer on the second layer.

8. The display panel according to claim 7, wherein the first inclined face is a side of the first layer and wherein the second inclined face is a formed by a side of the second layer and a side of the third layer together.

9. The display panel according to claim 1, wherein a sidewall of the recess comprises an inner recessed structure recessed toward an interior of the backplate and located at a position of the sidewall of the recess that is in proximity to the first conductive portion.

10. The display panel according to claim 9, wherein a depth of the inner recessed structure is less than a width of an orthographic projection of the first inclined face on the backplate.

11. The display panel according to claim 1, wherein the bottom surface of the recess comprises a sub-recess having at least one of the following parameters:

i) a width substantially equal to a distance between the extension portions in a same recess, of adjacent second conductive portions, or ii) a depth of the sub-recess is not greater than $\frac{1}{3}$ of a minimum depth of the recesses.

12. The display panel according to claim 1, wherein an inclination angle of the connecting portion of the second conductive portion with respect to the extension portion is less than or equal to an inclination angle of the sidewall of the first recessed portion with respect to the bottom.

13. The display panel according to claim 1, further comprising:

a light-emitting functional layer on a side of the pixel definition layer opposite the backplate; and a second electrode on a side of the light-emitting functional layer opposite the backplate.

14. The display panel according to claim 13, wherein the light-emitting functional layer comprises:

a first light-emitting functional sublayer on a side of the pixel definition layer opposite the backplate and configured to emit a first color light;

a charge generating layer on a side of the first light-emitting functional sublayer opposite the backplate;

a second light-emitting functional sublayer on a side of the charge-generating layer opposite the backplate and configured to emit light of a second color; and a third light-emitting functional sublayer on a side of the second light-emitting functional sublayer opposite the backplate and configured to emit light of a third color.

15. The display panel according to claim 13, wherein the second electrode comprises:

a plurality of second flat portions corresponding to the plurality of first electrodes, respectively, an orthographic projection of each second flat portion on the backplate is within an orthographic projection of the corresponding first electrode on the backplate; and a plurality of second recessed portions corresponding to the plurality of recesses, respectively, and an orthographic projection of each second recessed portion on the back plate covering an orthographic projection of the corresponding recess on the back plate.

16. A display device comprising a display panel according to claim 1.

* * * * *